（12） United States Patent
Ho et al.

(10) Patent No.: US 9,084,350 B2
(45) Date of Patent: Jul. 14, 2015

(54) CUSHION STRUCTURE AND ELECTRONIC DEVICE

(71) Applicant: Acer Incorporated, New Taipei (TW)

(72) Inventors: Chung-Jen Ho, New Taipei (TW); Huan-Chang Nien, New Taipei (TW)

(73) Assignee: Acer Incorporated, New Taipei (TW)

( * ) Notice: Subject to any disclaimer, the term of this patent is extended or adjusted under 35 U.S.C. 154(b) by 72 days.

(21) Appl. No.: 14/064,215

(22) Filed: Oct. 28, 2013

(65) Prior Publication Data

US 2015/0062810 A1    Mar. 5, 2015

(30) Foreign Application Priority Data

Sep. 3, 2013  (TW) ............... 102131677 A

(51) Int. Cl.
  *G06F 1/16*  (2006.01)
  *H05K 5/02*  (2006.01)
(52) U.S. Cl.
  CPC ............ *H05K 5/0234* (2013.01); *G06F 1/1656* (2013.01); *H05K 5/02* (2013.01)
(58) Field of Classification Search
  USPC ................. 361/679.55, 679.59; 248/188.8
  See application file for complete search history.

(56) References Cited

U.S. PATENT DOCUMENTS

| | | | |
|---|---|---|---|
| 6,357,717 B1 * | 3/2002 | Kennard, IV | 248/638 |
| 6,498,719 B1 * | 12/2002 | Bridges | 361/679.34 |
| 6,809,916 B2 * | 10/2004 | Nakata et al. | 361/115 |
| 6,870,732 B2 * | 3/2005 | Huang et al. | 361/679.17 |
| 6,979,778 B2 * | 12/2005 | Xiong et al. | 174/50 |
| 7,245,484 B2 * | 7/2007 | Langerhans et al. | 361/679.27 |
| 7,697,283 B2 * | 4/2010 | Mathew et al. | 361/679.59 |
| 8,199,498 B2 * | 6/2012 | Wang et al. | 361/679.59 |
| 8,213,177 B2 * | 7/2012 | Uttermann et al. | 361/679.59 |
| 2003/0179543 A1 * | 9/2003 | Sri-Jayantha et al. | 361/683 |
| 2004/0025993 A1 * | 2/2004 | Russell | 150/154 |
| 2004/0264118 A1 * | 12/2004 | Karidis et al. | 361/683 |
| 2008/0074831 A1 * | 3/2008 | Lee et al. | 361/683 |
| 2008/0251663 A1 * | 10/2008 | Tracy et al. | 248/188.8 |
| 2008/0253081 A1 * | 10/2008 | Tracy et al. | 361/687 |
| 2011/0122562 A1 * | 5/2011 | Lev et al. | 361/679.27 |

\* cited by examiner

*Primary Examiner* — Adrian S Wilson

(74) *Attorney, Agent, or Firm* — Jianq Chyun IP Office

(57) ABSTRACT

A cushion structure suitable for an electronic device is provided. The cushion structure includes cushions and at least one channel. Each cushion has a first surface and a second surface that are flexible and opposite to each other. Each cushion is combined to a body of the electronic device through its second surface, and the electronic device is placed on and in contact with a platform through the first surfaces of the cushions. The channel is in the body and communicated with the second surfaces. The channel is filled with a fluid that is in contact with the second surfaces of the cushions. When the first surface of at least one of the cushions sustains a force and deforms toward the second surface, the fluid in the channel is compressed to drive the second surfaces of the other cushions to deform toward the first surfaces to support the electronic device.

12 Claims, 5 Drawing Sheets

CUSHION STRUCTURE AND ELECTRONIC DEVICE

CROSS-REFERENCE TO RELATED APPLICATION

This application claims the priority benefit of Taiwan application serial no. 102131677, filed on Sep. 3, 2013. The entirety of the above-mentioned patent application is hereby incorporated by reference herein and made a part of this specification.

BACKGROUND OF THE INVENTION

1. Field of the Invention

The invention relates to a cushion structure and an electronic device applying the cushion structure.

2. Description of Related Art

Benefiting from the advancement in semiconductor devices and display technology, electronic devices are unceasingly developing in compliance with the requirement for compactness, multiple functions, and portability. Common portable electronic devices include personal digital assistants (PDAs), mobile phones, notebook computers, and so forth. In order to comply with the requirement for compactness, the portable electronic devices often have a foldable design, and thus the dimensions of the portable electronic devices can be reduced.

For instance, an exemplary normal notebook computer is composed of a body and a display screen, and the body and the display screen are pivoted to each other. The user of the notebook computer may shut the lid to close the host and the display screen by means of the relative rotation of the body and the display screen. When the user intends to use the notebook computer, the display screen is unfolded for further operation.

However, subject to the manufacturing process, the body often encounters the problem of manufacturing tolerance. Besides, the notebook computer is frequently placed on a work plane by means of cushions at the bottom of the body. On account of the aforesaid manufacturing tolerance, the cushions cannot be in perfect contact with the work plane when the notebook computer is placed on the work plane by means of the cushions. That is, there may exist a height difference between the work plane and at least one of the cushions, and the notebook computer in use is likely to sway or tilt due to the lack of sufficient support.

SUMMARY OF THE INVENTION

The invention is directed to a cushion structure that can be combined with a channel in a body and may thus deform in a proper manner, thereby allowing an electronic device to be stably placed on a work plane.

The invention is also directed to an electronic device that can be stably placed on a work plane by means of a cushion structure.

In an embodiment of the invention, a cushion structure suitable for an electronic device is provided. The cushion structure includes a plurality of cushions and at least one channel. Each of the cushions has a first surface and a second surface that are flexible and opposite to each other. Besides, each of the cushions is combined to a body of the electronic device through the second surface of each of the cushions, and the electronic device is placed on and in contact with a platform through the first surfaces of the cushions. The channel is placed in the body and communicated with the second surfaces of the cushions. The fluid is suitable for filling the channel and is in contact with the second surfaces of the cushions. When the first surface of at least one of the cushions sustains a force and deforms toward the second surface, the fluid in the channel is compressed to drive the second surfaces of the other cushions to deform toward the first surfaces, so as to support the electronic device.

In an embodiment of the invention, an electronic device that includes a body and a cushion structure is provided. The cushion structure is located at the body. Here, the cushion structure includes a plurality of cushions and at least one channel. Each of the cushions has a first surface and a second surface that are flexible and opposite to each other. Besides, each of the cushions is combined to the electronic device through the second surface of each of the cushions, and the electronic device is placed on and in contact with a platform through the first surfaces of the cushions. The channel is placed in the body and communicated with the second surfaces of the cushions. The fluid is suitable for filling the channel and is in contact with the second surfaces of the cushions. When the first surface of at least one of the cushions sustains a force and deforms toward the second surface, the fluid in the channel is compressed to drive the second surfaces of the other cushions to deform toward the first surfaces, so as to support the electronic device.

As discussed above, in the aforesaid cushion structure, the channel in the body is communicated with the cushions, such that the fluid is able to flow between the cushions and the channel of the cushion structure. Here, when any of the cushions sustains a force and deforms, parts of the fluid are compressed and thus flow to other cushions through the channel, so as to drive the cushions to deform toward the platform. Thereby, the electronic device is able to be stably placed onto the platform by means of the cushion structure.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
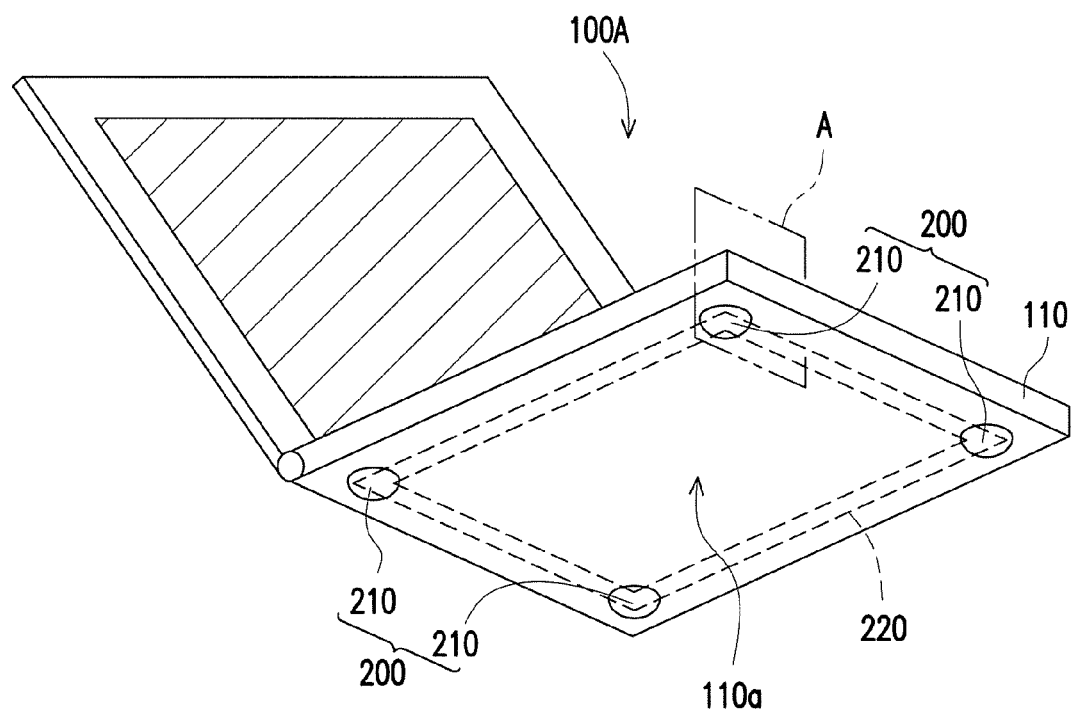
FIG. 1 is a schematic three-dimensional view illustrating an electronic device according to an embodiment of the invention.
Figure 2:
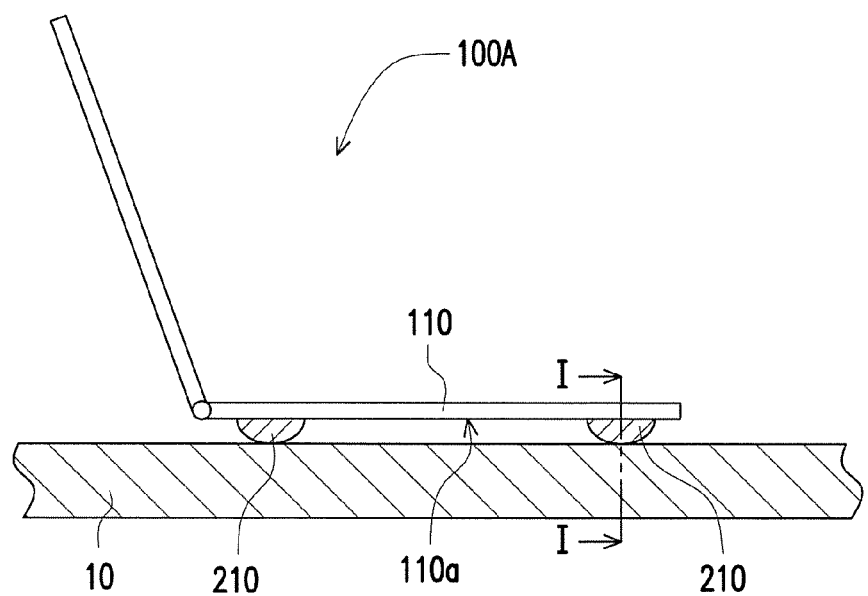
FIG. 2 is a side view illustrating the electronic device depicted in FIG. 1.
Figure 3:
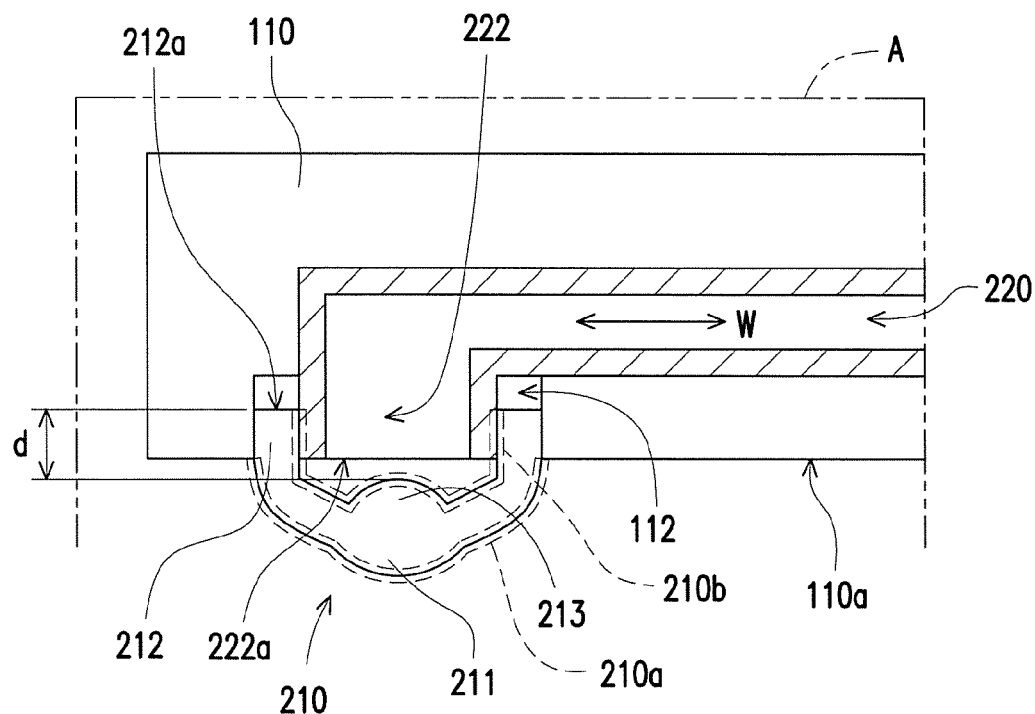
FIG. 3 is a schematic view illustrating the cross-section A depicted in FIG. 1.

FIG. 1 is a schematic three-dimensional view illustrating an electronic device according to an embodiment of the invention. FIG. 2 is a side view illustrating the electronic device depicted in FIG. 1. FIG. 3 is a schematic view illustrating the cross-section A depicted in FIG. 1. With reference to FIG. 1 to FIG. 3, in the present embodiment, for instance, the electronic device 100A is a notebook computer and is placed on a platform 10 through a cushion structure 200 at the bottom 100a of the body 110. Specifically, the cushion structure 200 includes a plurality of cushions 210 and at least one channel 220. The number of the cushions 210 is four, for instance, and the four cushions 210 are respectively located at four corners of the bottom 110a, such that the electronic device 100A can be stably placed on the platform 10.

In the present embodiment, each of the cushions 210 has a first surface 210a and a second surface 210b, and the first surface 210a and the second surface 210b are flexible and opposite to each other. Each of the cushions 210 is combined to a body 110 of the electronic device 100A through the second surface 210b of each of the cushions 210, and the electronic device 100A is placed on and in contact with the platform 10 through the first surfaces 210a of the cushions 210. The channel 220 is placed in the body 110 and communicated with the second surfaces 210b of the cushions 210. The fluid W is suitable for filling the channel 220 and is in contact with the second surfaces 210b of the cushions 210.

According to the present embodiment, the channel 220 has a plurality of extension channels 222. The extension channels 220 respectively extend to a plurality of vias 112 at the bottom 110a of the body 110, and each of the cushions 210 corresponds to one of the extension channels 222 and one of the vias 112 respectively located at four corners of the bottom 110a of the body 110. Specifically, each cushion 210 covers the corresponding via 112 through the second surface 210b of the cushion 210 and is bonded to the corresponding extension channel 222 through the second surface 210b, such that a fluid W flows between the channel 220 and the cushions 210.

Particularly, the channel 220 described in the present embodiment is a plastic channel installed in the body 110 and is a communication channel having a ring-shaped profile, for instance. The extension channels 222 are integrally formed on the plastic channel, and the vias 112 are formed on the body 110 through mechanical drilling, for instance. Besides, the cushions 210 are made of rubber or any other material characterized by flexibility and water-resistant capability, such that the fluid W may not be leaked out of the chamber constituted by the channel 220, the extension channels 222, and the cushions 210. Specifically, each of the cushions 210 includes a support portion 211 and a ring-shaped portion 212 surrounding the support portion 211, and when the electronic device 100A is placed on and in contact with the platform 10 through the first surfaces 210a of the cushions 210, the support portion 211 is in contact with the platform 10.

In another aspect, each of the cushions 210 is bonded to the corresponding extension channel 222 through one of the ring-shaped portions 212. Here, the ring-shaped portions 212 and the vias 112 may be adhered together by means of an adhesive, and the ring-shaped portions 212 and the extension channels 222 may be adhered together by means of an adhesive as well, so as to prevent the cushions 210 from falling off and prevent the fluid W from leaking. In addition, the sealability between the cushions 210 and the body 110 may be enhanced to prevent external moisture from entering the electronic device 100A and thus affecting the normal function and the life time of the electronic device 100A.

In the present embodiment, the fluid W is common pure water, for instance. To be specific, after the channel 220 (e.g., the aforesaid plastic channel) is placed in the body 110, and after the cushions 210 are bonded to the extension channels 222, the fluid W may be injected into a chamber (constituted by the channel 220, the extension channels 222, and the cushions 210) through an injection hole (not shown) that is located on the body 110 and communicated with the channel 220 or the extension channels 222. After the chamber is filled with the fluid W, the injection hole (not shown) is sealed by a water-proof adhesive, so as to prevent leakage of the fluid W. Certainly, the injection hole (not shown) may also be placed on the cushions 210, which should not be construed as a limitation to the invention. Besides, the arrangement of the cushions 210 is not limited in the invention; in another feasible embodiment, the cushions may be fixed to the four corners of the bottom 110a of the body 110 by applying a dual-material injection molding technique.

Figure 4:
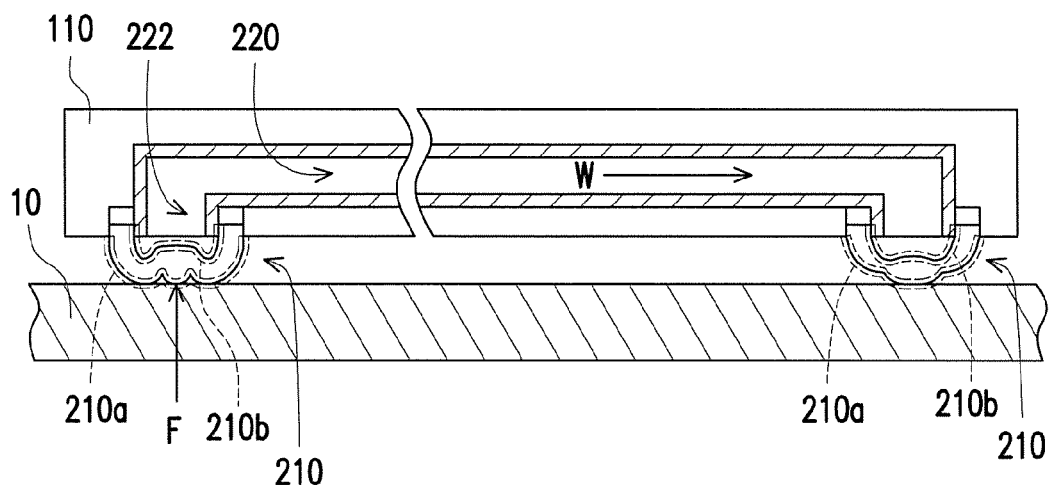
FIG. 4 is a schematic cross-sectional view illustrating the body depicted in FIG. 2 along a line segment I-I.

FIG. 4 is a schematic cross-sectional view illustrating the body depicted in FIG. 2 along a line segment I-I. With reference to FIG. 4, to be specific, when the body 110 of the electronic device 100A is subject to manufacturing tolerance and is placed on the platform 10 by means of the cushion structure 200, the cushions 210 may not be all in contact with the platform 10. For instance, three cushions 210 may be completely in contact with the platform 10, while there may exist a height difference between the other cushion 210 and the platform 10. Alternatively, after all of the cushions 210 are in contact with the platform 10, the body 110 is in a tilted state with respect to the platform 10.

In the present embodiment, three cushions 210 are completely in contact with the platform 10, and there is a height difference between the other cushion 210 and the platform 10. Particularly, the first surfaces 210a of the three cushions 210 (only one is exemplarily illustrated in the drawings) sustain a force F in a direction toward the body 110 and thus deform toward the second surfaces 210b, and the fluid W in the channel 220 is compressed to drive the second surface 210b of the cushion 210 not in contact with the platform 10 to deform toward the first surface 210a, so as to support the electronic device 100A by means of the support portion 211. Here, the force F is, for instance, a counterforce generated by the weight of the body 110 on the platform 10.

Namely, according to said arrangement, in the cushion structure 200, the deformation of some cushions 210 and the fluid W flowing to the other cushions 210 may lead to the balanced mechanism of automatic adjustment; moreover, each cushion 210 is able to be in contact with the platform 10 to support the electronic device 100A, such that the electronic device 100A can be stably placed on the platform 10 by means of the cushion structure 200 and does not sway or tilt. Thereby, during the operation of the electronic device 100A, the user's comfort may be guaranteed.

On the other hand, as shown in FIG. 3, each of the cushions 210 further includes a protrusion 213 that is connected to the support portion 211 and the ring-shaped portion 212, so as to prevent the cushions 210 from overly deforming due to the external force exerted onto the body 110. Each of the protrusions 213 faces an opening 222a of a corresponding extension channel 222, and the shortest distance d between the protrusion 213 and a top surface 212a of the ring-shaped portion 212 is smaller than or substantially equal to 1.1 mm. That is, in case that the cushions 210 sustain the external force and deform toward the body in the direction of the external force, the maximum deformation degree is subject to the protrusion 213 and thus does not exceed the minimum distance d.

Figure 5:
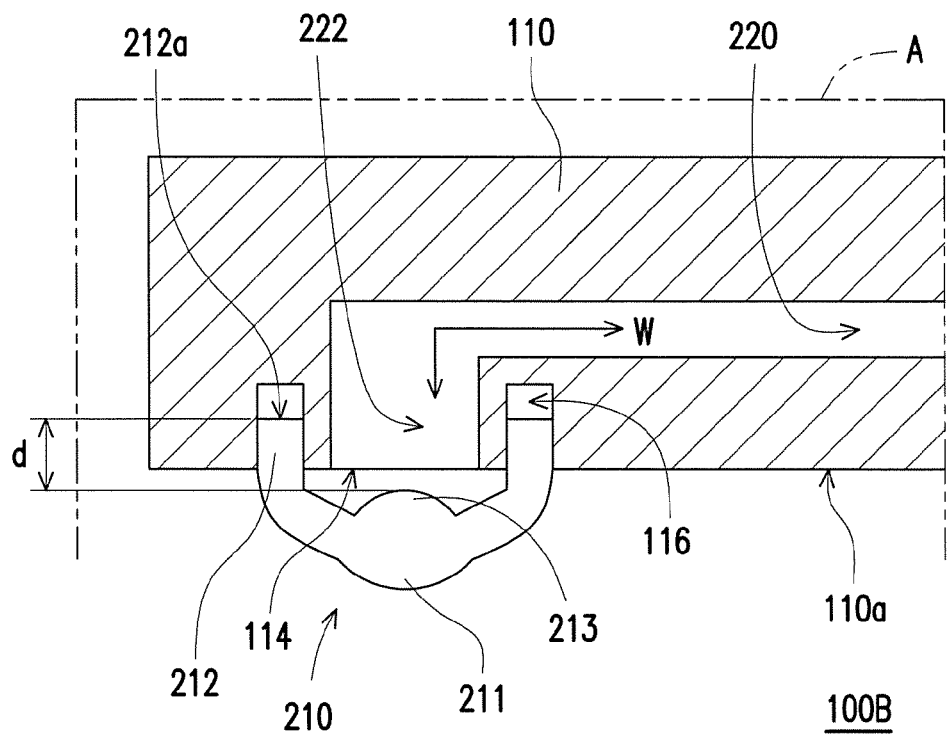
FIG. 5 is a schematic partial cross-sectional view illustrating an electronic device according to another embodiment of the invention.
Figure 6A:
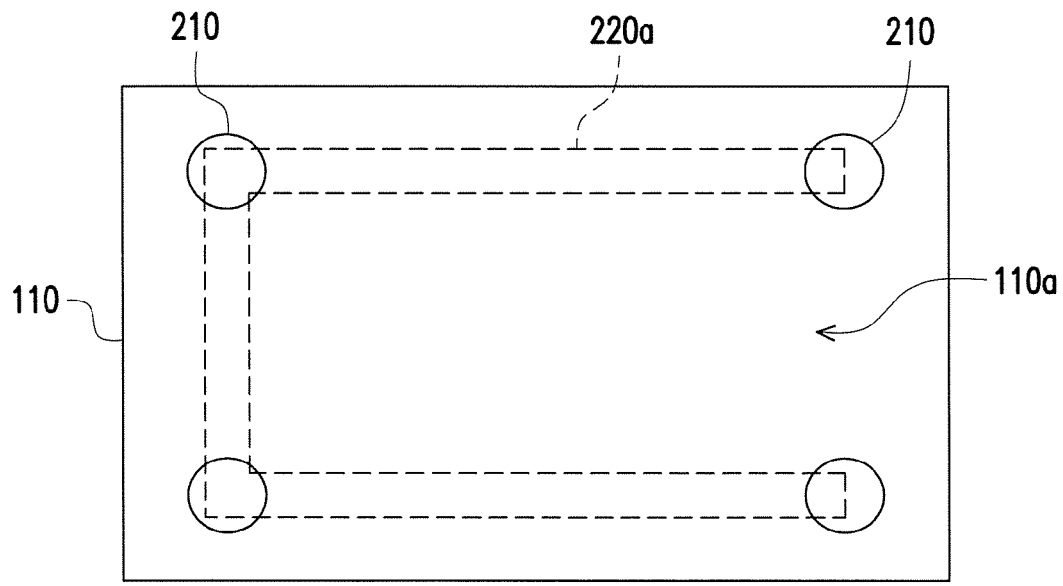
FIG. 6A to FIG. 6E are bottom views illustrating a body according to several other embodiments of the invention.
Figure 6B:
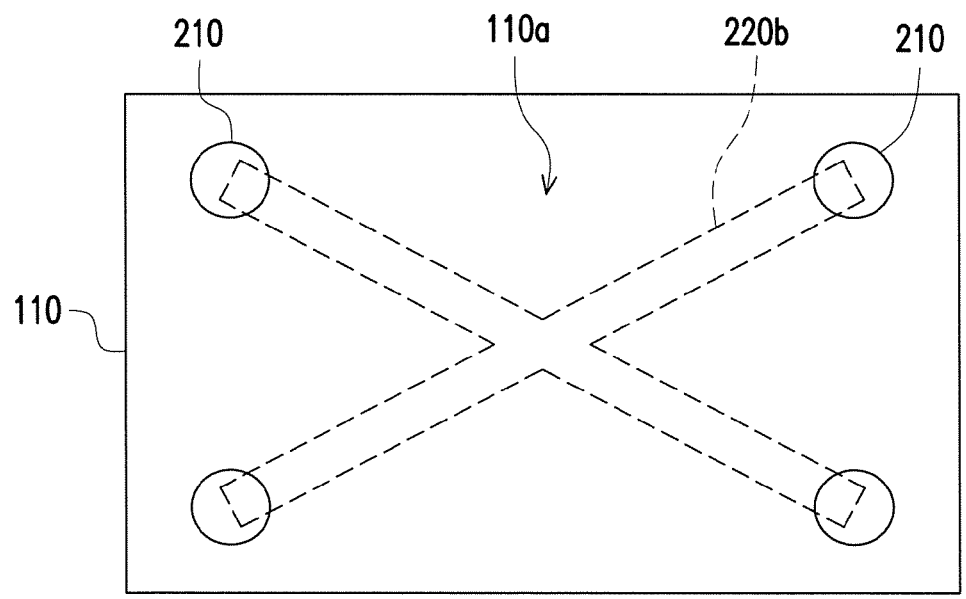
Figure 6C:
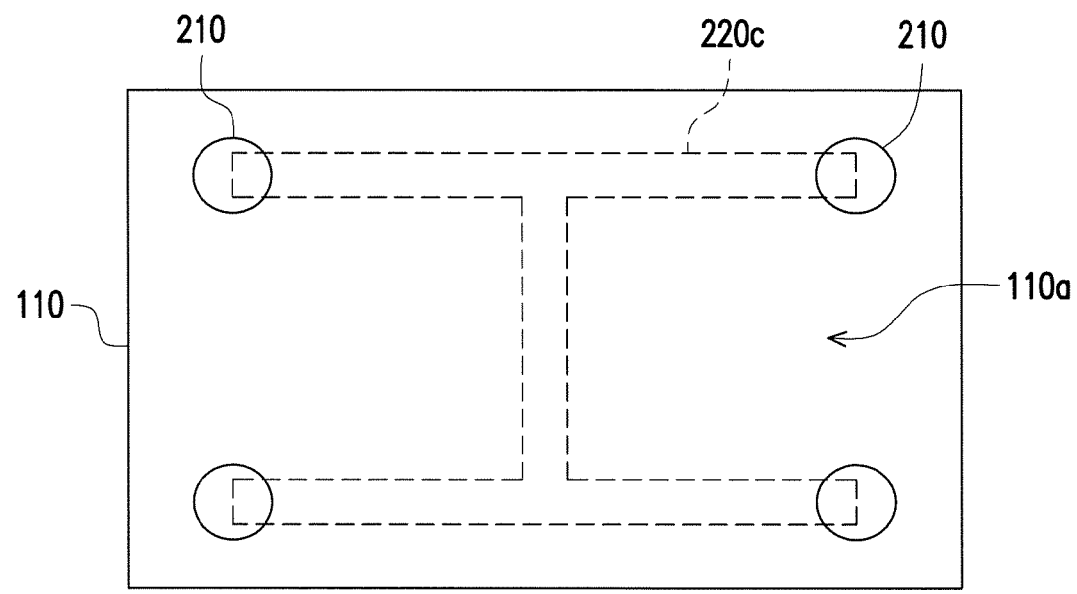
Figure 6D:
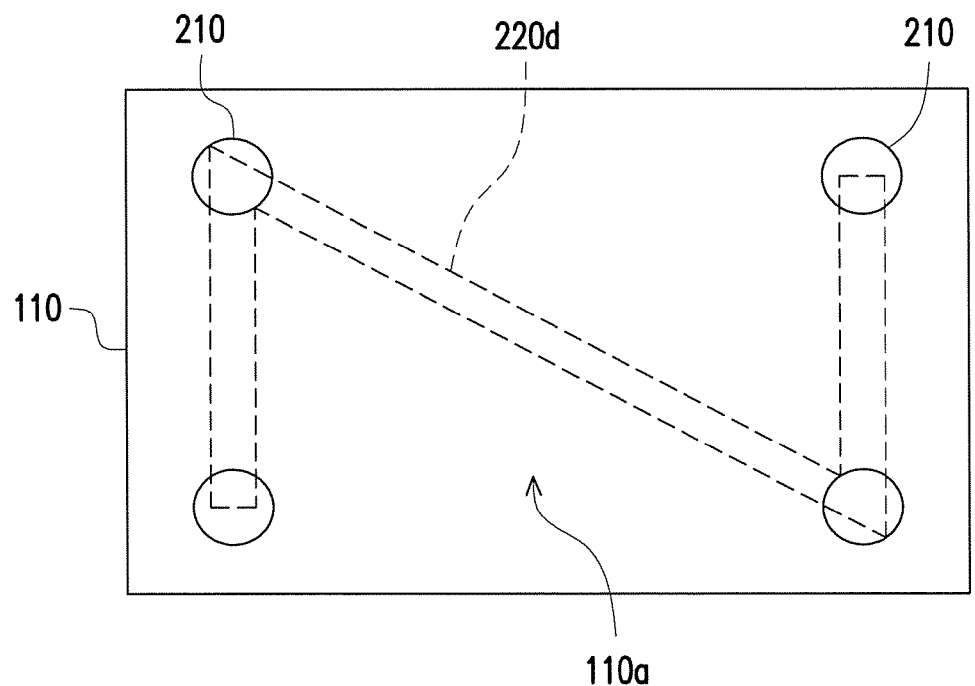
Figure 6E:
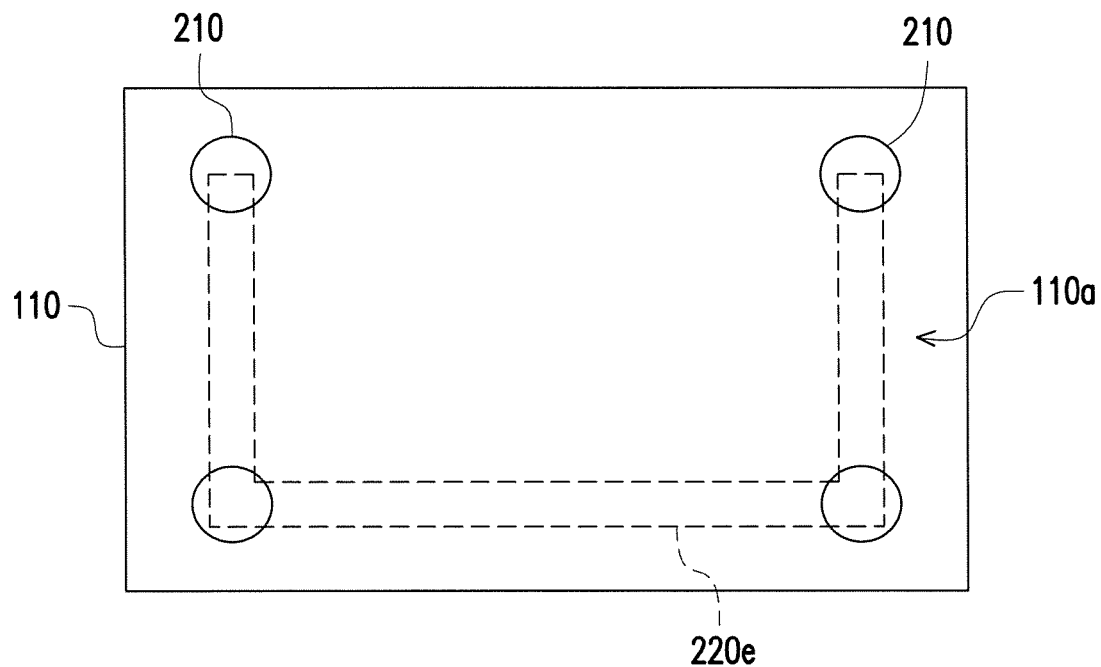

FIG. 5 is a schematic partial cross-sectional view illustrating an electronic device according to another embodiment of the invention With reference to FIG. 3, FIG. 4, and FIG. 5, the difference between the electronic device 100B shown in FIG. 5 and the electronic device 100A shown in FIG. 4 lies in that the channel 220 in the body 110 of the electronic device 100B is formed in the body by applying the mechanical drilling technique, and the extension channels 220 extend to the through vias of the channel 220 from the bottom 110a of the body 110 by applying the mechanical drilling technique as well, for instance. From another perspective, the vias 114 are the openings of the extension channels 222, for instance, and the body 110 has a plurality of ring-shaped trenches 116 respectively surrounding the vias 114.

Each of the cushions 210 is bonded to the corresponding one of the ring-shaped trenches 116 through one of the ring-shaped portions 212 by means of adhesives, so as to prevent the cushions 210 from falling off and prevent the fluid W from leaking. In addition, the sealability between the cushions 210 and the body 110 may be enhanced to prevent external moisture from entering the electronic device 100B and thus affecting the normal function and the life time of the electronic device 100B. On the other hand, the way to inject the fluid W into the chamber constituted by the channel 220, the extension channels 222, and the cushions 210 is similar to that described in the previous embodiment and thus will not be further described hereinafter. In brief, this arrangement allows the electronic device 100B and its cushion structure 200 to achieve substantially the same technical effects as those accomplished in the previous embodiment.

The way to arrange the channel 220 in the body 110 is not limited in the invention. In other embodiments that are not shown herein, for instance, the channel 220 may be a trench formed in the body 110, and a water-resistant component may be adhered to the trench, so as to prevent liquid (e.g., pure water) in the trench from leaking and etching the electronic components in the body.

The structural design of the channel 220 is not limited in the invention as well. Particularly, FIG. 6A to FIG. 6E are bottom views illustrating a body according to several other embodiments of the invention. As shown in FIG. 6A to FIG. 6E, the profile of the channels 220a to 220e is respectively shaped as a left square bracket, the letter X, the letter I, the letter N, or the letter U.

To sum up, in the aforesaid cushion structure, the channel in the body is communicated with the cushions, and the fluid is injected into the chamber defined by the channel and the cushions of the cushion structure, such that the fluid is able to flow between the cushions and the channel. Here, when any of the cushions sustains a force and deforms, parts of the fluid are compressed and thus flow to other cushions through the channel, so as to drive the cushions to deform toward the platform. Thereby, the electronic device is able to be stably placed onto the platform by means of the cushion structure.

Although the invention has been described with reference to the above exemplary embodiments, it will be apparent to one of ordinary skill in the art that modifications to the described exemplary embodiments may be made without departing from the spirit of the invention. Accordingly, the scope of the invention will be defined by the attached claims and not by the above detailed descriptions.

What is claimed is:

1. A cushion structure suitable for an electronic device, the cushion structure comprising:
   a plurality of cushions, each of the cushions having a first surface and a second surface, the first surface and the second surface being flexible and opposite to each other, each of the cushions being combined to a body of the electronic device through the second surface of the each of the cushions, the electronic device being placed on and in contact with a platform through the first surfaces of the cushions; and
   at least one channel located in the body and communicated with the second surfaces of the cushions, a fluid being suitable for filling the at least one channel and being in contact with the second surfaces of the cushions, wherein when the first surface of at least one of the cushions sustains a force and deforms toward the second surface of the at least one of the cushions, the fluid in the channel is compressed to drive the second surfaces of the other cushions to deform toward the first surfaces of the other cushions to support the electronic device.

2. The cushion structure as recited in claim 1, wherein the at least one channel has a plurality of extension channels respectively extending to a plurality of vias at a bottom of the body, and each of the cushions covers a corresponding via of the vias and is bonded to a corresponding extension channel of the extension channels through the second surface of the each of the cushions, such that the fluid flows between the at least one channel and the cushions.

3. The cushion structure as recited in claim 2, wherein each of the cushions comprises a support portion and a ring-shaped portion surrounding the support portion, and when the electronic device is placed on and in contact with the platform through the first surfaces of the cushions, the support portion is in contact with the platform.

4. The cushion structure as recited in claim 3, wherein each of the cushions further comprises a protrusion connected to the support portion and the ring-shaped portion, each of the protrusions faces an opening of a corresponding extension channel of the extension channels, and a shortest distance between the protrusion and a top surface of the ring-shaped portion is smaller than or substantially equal to 1.1 mm.

5. The cushion structure as recited in claim 3, wherein the at least one channel is a plastic channel installed in the body, and each of the cushions is bonded to the corresponding extension channel through one of the ring-shaped portions and is located in the corresponding via.

6. The cushion structure as recited in claim 3, wherein the vias are the openings of the extension channels, the body has a plurality of ring-shaped trenches respectively surrounding the vias, and each of the ring-shaped portions is bonded to an inside of a corresponding ring-shaped trench of the ring-shaped trenches.

7. An electronic device comprising:
   a body; and
   a cushion structure located at the body, the cushion structure comprising:
      a plurality of cushions, each of the cushions having a first surface and a second surface, the first surface and the second surface being flexible and opposite to each other, each of the cushions being combined to the body through the second surface of the each of the cushions, the electronic device being placed on and in contact with a platform through the first surfaces of the cushions; and
      at least one channel located in the body and communicated with the second surfaces of the cushions, a fluid being suitable for filling the at least one channel and being in contact with the second surfaces of the cushions, wherein when the first surface of at least one of the cushions sustains a force and deforms toward the second surface of the at least one of the cushions, the fluid in the channel is compressed to drive the second surfaces of the other cushions to deform toward the first surfaces of the other cushions to support the electronic device.

8. The electronic device as recited in claim 7, wherein the at least one channel has a plurality of extension channels respectively extending to a plurality of vias at a bottom of the body, and each of the cushions covers a corresponding via of the vias and is bonded to a corresponding extension channel of the extension channels through the second surface of the each of the cushions, such that the fluid flows between the at least one channel and the cushions.

9. The electronic device as recited in claim 8, wherein each of the cushions comprises a support portion and a ring-shaped portion surrounding the support portion, and when the electronic device is placed on and in contact with the platform through the first surfaces of the cushions, the support portion is in contact with the platform.

10. The electronic device as recited in claim 9, wherein each of the cushions further comprises a protrusion connected to the support portion and the ring-shaped portion, each of the protrusions faces an opening of a corresponding extension channel of the extension channels, and a shortest distance between the protrusion and a top surface of the ring-shaped portion is smaller than or substantially equal to 1.1 mm.

11. The electronic device as recited in claim 9, wherein the at least one channel is a plastic channel installed in the body, and each of the cushions is bonded to the corresponding extension channel through the ring-shaped portion and is located in the corresponding via.

12. The electronic device as recited in claim 9, wherein the vias are the openings of the extension channels, the body has a plurality of ring-shaped trenches respectively surrounding the vias, and each of the ring-shaped portions is bonded to an inside of a corresponding ring-shaped trench of the ring-shaped trenches.

\* \* \* \* \*